United States Patent

Fehlauer et al.

[11] Patent Number: 5,295,163
[45] Date of Patent: Mar. 15, 1994

[54] SYNCHRONIZATION METHOD FOR A RUN LENGTH-LIMITED (1,7)-CODE, AND CIRCUIT ARRANGEMENT FOR SAID METHOD

[75] Inventors: Ewald Fehlauer, Weiterstadt; Wolfram Zirngibl, Schwalbach; Jens Lehmann, Riedstadt, all of Fed. Rep. of Germany

[73] Assignee: U.S. Philips Corporation, New York, N.Y.

[21] Appl. No.: 929,935

[22] Filed: Aug. 14, 1992

[30] Foreign Application Priority Data

Aug. 23, 1991 [DE] Fed. Rep. of Germany ....... 4127984

[51] Int. Cl.$^5$ .............................................. H04L 7/00
[52] U.S. Cl. ..................................... 375/114; 375/116; 371/47.1

[58] Field of Search ............... 375/114, 116, 118, 122; 370/105.4, 106; 371/47.1; 358/133, 138, 427; 341/55

[56] References Cited

U.S. PATENT DOCUMENTS

| | | | |
|---|---|---|---|
| 4,694,473 | 9/1987 | Etoh | 375/114 |
| 4,744,081 | 5/1988 | Buckland | 375/114 |
| 4,821,270 | 4/1989 | Mauge | 375/114 |
| 5,181,229 | 1/1993 | Langlais et al. | 370/106 |

Primary Examiner—Stephen Chin
Attorney, Agent, or Firm—Edward W. Goodman

[57] ABSTRACT

For word synchronization of a run length-limited (1.7)-code with a code rate of ⅔ a synchronization sequence is inserted in the bit-serial sequence of three bit-wide code words, which synchronization sequence includes at least three consecutive three-bit wide code words and has at least six zeros ("0") between two ones ("1").

10 Claims, 2 Drawing Sheets

SYNCHRONIZATION METHOD FOR A RUN LENGTH-LIMITED (1,7)-CODE, AND CIRCUIT ARRANGEMENT FOR SAID METHOD

BACKGROUND OF THE INVENTION

1. Field of the Invention

The invention relates to a synchronization method for a run length-limited (1.7)-code with a code rate of ⅔, in which code, data bits of a serial data stream are subdivided into two-bit wide data words and transcoded into three-bit wide code words, a sequence of the three-bit wide code words between adjacent ones ("1") comprising at least one zero ("0") but at most seven zeros ("0") and in which for the phase-correct decoding of the three-bit wide code words, a given synchronization bit sequence is inserted in the data stream of the code words.

2. Description of the Related Art (1.7)-codes are used as channel codes in magnetically recording/reproducing data so as to increase the recording density or reduce the error rate. The journal IEEE Transactions on Magnetics, Vol. MAG-12, No. 6, November 1976, pages 740 to 742, describes such a run length-limited (1.7)-code in which each one ("1") must be separated from a subsequent one ("1") by a given number of zeros ("0"). In a (1.7)-code, a minimum of one and a maximum of seven zeros ("0") may occur between subsequent ones ("1"). The one ("1") bits within a coded bit sequence characterize the position of flux changes. A channel coding of the data bits provided by a source coder into code bits is performed in such a way that the data bits are subdivided into words of two bits and are transcoded into three-bit code words. The code rate is thus ⅔.

U.S. Pat. No. 4,337,458 describes a method of coding a run length-limited (1.7)-code with a code rate of ⅔c in which the four possible two-bit data words of the values 00, 01, 10 and 11 are converted into three-bit code words. The following Table shows a corresponding basic coding:

| Data Word | Code Word |
| --- | --- |
| 00 | 101 |
| 01 | 100 |
| 10 | 001 |
| 11 | 010 |

Since this basic coding at the limits of the code words would also generate a transition between two "1" having a one-bit distance only, an additional coding prescription is used for these cases. The following Table shows this corresponding additional coding:

| Data Words | | Colliding Code Words | | Supplied Code Words | |
| --- | --- | --- | --- | --- | --- |
| current | subsequent | current | subsequent | current | subsequent |
| 00 | 00 | 101 | 101 | 101 | 000 |
| 00 | 01 | 101 | 100 | 100 | 000 |
| 10 | 00 | 001 | 101 | 001 | 000 |
| 10 | 01 | 001 | 100 | 010 | 000 |

This channel code thus utilizes only a word supply with the following five words: 101, 100, 001, 010 and 000. Due to the dependence of coding on the subsequent word, this code is also referred to as look-ahead code. Tables for coding and decoding of the (1.7)-code are shown in column 4 of U.S. Pat. No. 4,337,458.

Another form of coding and decoding of a (1.7)-code with a code rate of ⅔ is known from IBM Technical Disclosure Bulletin, Vol. 23, No. 9, February 1981, pages 4375 to 4378.

In order to re-transform the 3-bit code word sequence recorded on a magnetic carrier into a 2-bit data word sequence at the reproducing end, the word limits of the reproduced 3-bit code words must first be determined. It is known from U.S. Pat. No. 4,868,690 to insert a special synchronous word in the sequence of the 3-bit code words to be recorded and to record it together with the 3-bit code word sequences. In the relevant case, the special synchronous word consists of a sequence of a plurality of code words of the digital value 010. It is attempted, at the reproducing end, to determine the position with respect to time of the inserted synchronous word sequence so as to define the word limits of the reproduced code words for subsequent decoding. The synchronous word recognition is realized by means of a shift register and an AND-gate connected to the outputs of the shift register. Stringent requirements are imposed on the synchronization of the reproduced code words, because an erroneous synchronization by one bit length already leads to a total loss of data.

SUMMARY OF THE INVENTION

The present invention has for its object to provide a further synchronization method for a run length-limited (1.7)-code enabling an unambiguous synchronization of the 3-bit code words.

This object is achieved by means of the method as described above, characterized in that a synchronization sequence comprising at least three consecutive three-bit wide code words is generated as the synchronization bit sequence to be inserted, which sequence has at least six zeros ("0") between two ones ("1"), and in that the temporal position of the inserted synchronization sequence is defined by determining the number of zeros ("0") between two ones ("1") so as to recognize word limits of serially transmitted code words.

The method according to the invention has the advantage that it reduces the risk of erroneous synchronization as compared with the state of the art.

A particularly advantageous aspect of the invention is that a circuit arrangement for performing the method only comprises a small number of components.

These and other aspects of the invention will be apparent from and elucidated with reference to the embodiments described hereinafter.

DESCRIPTION OF THE PREFERRED EMBODIMENT

Figure 1:
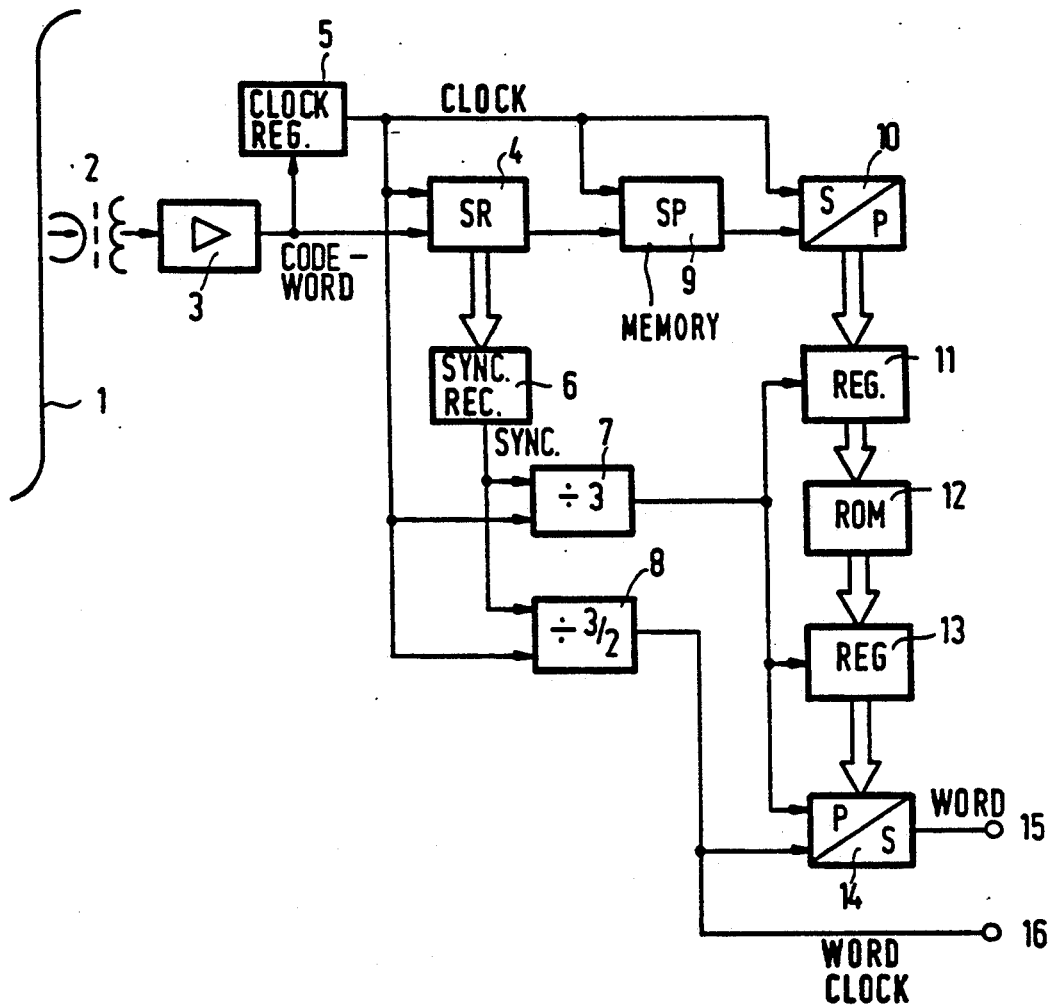
FIG. 1 shows the block diagram of a channel decoder to explain the synchronization method according to the invention.

In the block diagram of FIG. 1 the reference numeral 1 denotes a magnetic tape from which a recorded digital signal is derived by means of a reproducing magnetic head 2. It is assumed that before the recording operation, the digital signal has been subjected to a channel coding in accordance with the method described in U.S. Pat. No. 4,337,458. It is also assumed that the 3-bit code words are combined to one code word block which is preceded by a synchronization sequence of the form 0.100.000.001.0, or by a synchronization sequence of the form 0.100.000.010.000.001.0

In these two synchronization sequences, the dots denote word limits, the ones ("1") denote a flux change and the zeros ("0") denote the absence of a flux change.

Figure 2:
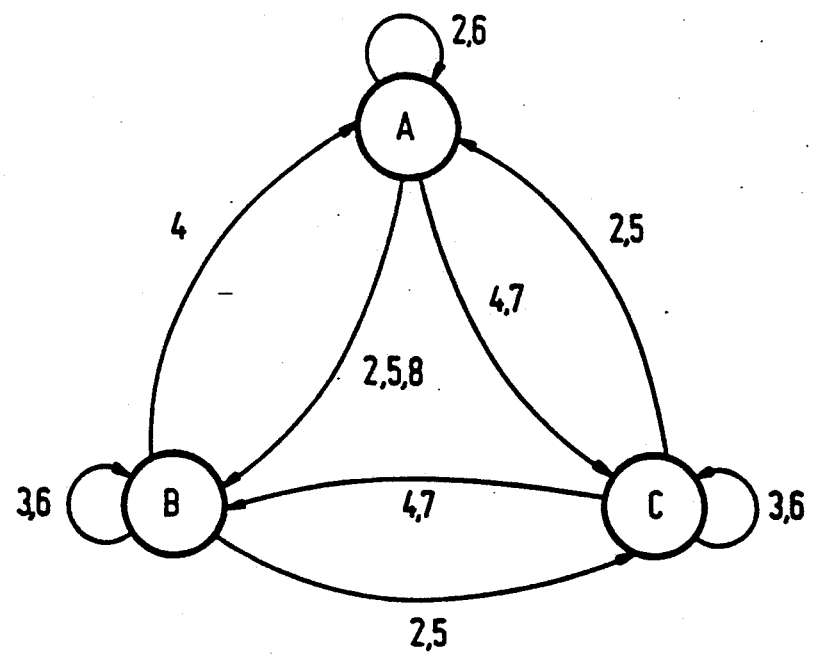
FIG. 2 shows a state diagram of the (1.7) code.

When considering a state diagram of the (1.7)-code in FIG. 2, it can be concluded that the two proposed synchronization sequences allow an unambiguous synchronization of the 3-bit code words. In the state diagram, the references A, B and C denote possible states of the 3-bit code words. The numerals inscribed next to the state transitions indicate the number of bits located between two transitions. A representation of the (1.7)-code in this manner is known from the Journal IEEE Transactions on Communications, Volume 37, No. 9, September 1989, pages 906 to 917. The state diagram that state B is reached, both after the occurrence of a synchronization sequence with the distance 8 and after the two consecutive occurrences of the synchronization sequence with the distance 7. However, in a sequence with the distance 8, the state A changes directly to the state B, whereas the state B in a sequence with the distance 7 can only be reached via the diversion via state C. The unambiguous synchronization results from the asymmetry of the relevant state diagram.

If the longer synchronization sequence is used, the probability of an erroneous synchronization is smaller than for the shorter synchronization sequence with the distance 8. However, with reference to the number of components required for recognizing the two synchronization sequences, the shorter synchronization sequence is to be preferred.

To generate the longer synchronous word sequence, the state of preceding and subsequent data words is to be taken into account. For example, a bit sequence of the following binary

```
data words    00   00  11   00   10  10   11   11
= Hex        |  0   |   3    |    5   |   F   | results in the
code words   100  100 100 000  010 000  001 001.
```

This selected bit sequence of the data words corresponds to the two synchronization words laid down in the EBU standard Tech. 3252-E with the hexadecimal value of 30 F5 in which a recording of the two hexadecimal synchronization words 30 F5 starts each time with the least significant bit. The underlined bits of the code words obtained advantageously correspond to the proposed longer synchronization sequence.

The digital signal derived from the magnetic tape by means of the reproducing magnetic head 2 is preamplified and equalized in a stage 3. The signal thus prepared is applied to the input of a shift register 4 and to the input of a clock regenerator 5. The clock which is the basis for the prepared digital signal is regained in the clock regenerator 5 formed as a PLL. With this clock the prepared digital signal, which comprises the data and the synchronous sequence as 3-bit code words, is serially entered into the shift register 4. Subsequently, the data signal, which is present at bit-parallel outputs of the shift register 4, is checked in a stage 6 on whether a bit sequence corresponding to the inserted synchronous word is present in the data stream of the prepared digital signal. Such a check may be performed, for example in such a way that in the case of inserting the shorter synchronization sequence the presence of seven consecutive zeros ("0") is queried by way of comparison.

Another possibility of recognizing a synchronization sequence inserted into the data stream is to apply the serial digital signal which can be derived from the output of stage 3 to a counting circuit which counts the number of zeros ("0") between two ones ("1"). Such a counting circuit will hereinafter be described with reference to FIG. 3.

When a given synchronization sequence in the stream of the serial digital signal is recognized, the stage 6 supplies a synchronizing pulse (Sync) which resets a 3-divider 7 and a 3/2-divider 8. The clock signal generated by the clock regenerator 5 is present at counting inputs of the dividers 7 and 8. A code word clock signal can be derived from an output of the 3-divider 7 and a data word clock signal can be derived from the output of the 3/2-divider 8.

In addition to bit-parallel outputs, the shift register 4 also has a serial output. The serial digital signal which is time-delayed by the shift register 4 is supplied from this output via a memory 9 to a series/parallel converter 10. The bit-parallel digital signal which can be derived from parallel outputs of the series/parallel converter 10 is code word clock-controlled and loaded into a register 11, for example a D-flipflop. The series/parallel converter 10 and the register 11 are designed in such a way that the register 11 can provide bit-parallel code words which comprise a current code word, the next code word as well as the last bit position of the previous code word. The parallel code words thus being present are stored as addresses in a memory 12 in which a decoding table in accordance with U.S. Pat. No. 4,337,458 mentioned in the opening paragraph is stored. The output data of the memory 12 are the decoded data words which are code word clock-controlled and are buffered in a further register 13 and applied to parallel inputs of a parallel/series converter 14. Data words which are present at parallel inputs of the parallel/series converter 14 are also code word clock-controlled and taken over by the parallel/series converter 14 and subsequently series/parallel converted at ⅔ of the input clock frequency and supplied from an output terminal 15. The associated clock signal of the data words is supplied from a terminal 16 in parallel with the serially supplied data words.

Preceding data words up to the full memory level of the memory 9 can be decoded by inserting a memory 9 between the arrangement for synchronous word recognition and the arrangement for decoding the serially available code words.

Figure 3:
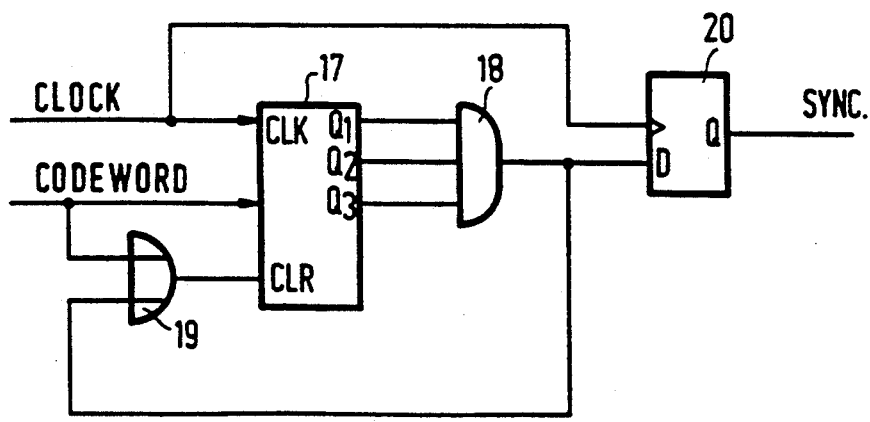
FIG. 3 shows a circuit arrangement for deriving a synchronizing signal.

The circuit arrangement for deriving a synchronizing signal shown in FIg. 3 is suitable for checking on a bit-serial level whether there is a given synchronization sequence in the digital signal which can be derived from the output of stage 3. The reset input of a counter 17 then receives the bit-serial digital signal (code word) and a clock input receives the clock signal (clock) generated by the clock regenerator. The counter 17 counts the bit periods between two transitions ("1"). The count of the counter 17 is requested by means of an AND-gate 18. Dependent on the selected synchronization sequence, corresponding taps of the counter 17 are to be connected to inputs of the AND-gate 18. If a correspondingly long zero sequence which is characteristic of the selected synchronization sequence is recognized in the applied bit-serial data stream, the counter 17 is set via an OR coupling with an OR-gate 19. Simultaneously, the logic level present at the output of the AND-gate 18 is stored in a register 20 with the clock of the clock signal (clock) which provides the synchronous signal (Sync) for resetting the counters 7 and 8.

The synchronization sequences so far considered
0.100.000.001.0 and
0.100.000.010.000.001.0
may also be comprised as data in the natural data stream. A true recognition of the synchronization sequences inserted in the data stream of the code words requires additional measures. In a further embodiment of the method according to the invention it is possible to dispense with such additional measures if a synchronization sequence is inserted in the bit-serial data stream which comprises at least one sequence of equally polarized bits exceeding the originally maximum permitted number by one. This sequence may be used for unambiguous synchronization. In principle, this method is equivalent to a changed mapping prescription in the coding of the data words. Such a new synchronization sequence can be generated without changing the word supply. The distinction as compared with the current mapping prescription is that the low frequency signal spectral contents are increased in the case of a higher maximum run length. This change may, however, be limited by forming the entire synchronization sequence without a d.c. component. In the relevant embodiment, the synchronization sequence based on a changed mapping prescription may have a length of two 8-bit data words, resulting in the following bit sequence.

3 and 2 to 4. It can be concluded that the run lengths produced at the limits of the synchronization sequence do not violate the mapping prescription of the coding table shown in U.S. Pat. No. 4,337,458. An insertion of this synchronization sequence in the serial code word stream is thus possible without any restriction. In addition to a desired d.c. freedom, this synchronization sequence has the advantage that the dual run length of 9 bits provides the possibility of designing a circuit arrangement for synchronization recognition with a tolerance for errors.

This special synchronization sequence may not only be used advantageously for code word synchronization in a channel decoder, but also in a signal processing circuit succeeding the channel decoder, for example a circuit for processing signals in accordance with the prescriptions laid down in the EBU Standard Tech. 3252-E if at the coder end corresponding data of the code word "010 000 000 010 000 000 010 010" instead of the fixed synchronous words (30 $F5_{hex}$) are incorporated in the data stream and evaluated at the decoder end. Due to this measure, a synchronous word sequence is evaluated which would normally not occur in the serial data stream and a 1-bit error tolerance system is produced in which one of the two 8-bit zero sequences may be disturbed by a 1-bit error without an error synchronization occurring.

As has been described hereinbefore, a coding or decoding table for converting the 2-bit data words into 3-bit code words while taking the run lengths of a (1.7)-code into account may be formed in a different manner. When using coding and decoding tables in accordance with IBM Technical Disclosure Bulletin, Vol. 23, No. 9, February 1981, pages 4375 to 4378, the insertion of an

| 8-bit code word: | 1st word | | | | | | | 2nd word | | | | | | | | |
|---|---|---|---|---|---|---|---|---|---|---|---|---|---|---|---|---|
| Bit No.: | 1 | 2 | 3 | 4 | 5 | 6 | 7 | 8 | 9 | 10 | 11 | 12 | 13 | 14 | 15 | 16 |
| code word No.: | 1 | | 2 | | 3 | | 4 | | 5 | | 6 | | 7 | | 8 | |
| code word: | 010 | | 000 | | 000 | | 010 | | 000 | | 000 | | 010 | | 010 | |

When coding this synchronization sequence, values of code words preceding a first code word of the synchronization sequence as well as values of code words following the last word of the synchronization sequence are to be taken into account because of the look-ahead property of the (1.7)-code. The following Tables show this relationship.

| preceding words | first synchronous word |
|---|---|
| d d d d 0 1 | 0 1 0 |
| 1 0 0 0 0 0 | |
| last synchronous word | succeeding words |
| 0 1 0 | 1 0 d |
| | 0 0 1 |

In these Tables, the symbol d stands for don't care. With the preceding and succeeding code words the run lengths of the synchronization sequences are 2 to 7, 9, 9, unambiguous synchronous sequence in the code word data stream having the bit sequence of "000.000.010" has been found to be advantageous. To generate such a synchronization sequence, a predetermined initial state is necessary which is to be defined at the start of a data transmission. It should then be noted that an arbitrary state may be present, starting from the initial state up to the instant of inserting the synchronization sequence in the accidental stream of the code words. It is thus necessary to change from an arbitrary state to a state $\sigma 0$ which characterizes the start of a state diagram shown in the IBM Technical Disclosure Bulletin. For this purpose, a variable part may precede the data words of the synchronization sequence to be inserted so that the following composition between data words and code words in connection with the synchronization sequence results:

| | data words before coding | | | | code words after coding | | | |
|---|---|---|---|---|---|---|---|---|
| $\sigma 0$ | | | | | | | | |
| XXXXXXX00 | 0101101 | XXXXXX | XX1 | 001 | 000 | 000 | 010 | XXX |
| $\sigma 1$ | | | | | | | | |
| XXXXXXX00 | 0101101 | XXXXXX | X1X | 101 | 000 | 000 | 010 | XXX |
| $\sigma 2$ | | | | | | | | |
| XXXXXXX10 | 0101101 | XXXXXX | 1XX | 001 | 000 | 000 | 010 | XXX |
| $\sigma 3$ | | | | | | | | |

-continued

| | data words before coding | | code words after coding | | | | |
|---|---|---|---|---|---|---|---|
| XXXXXXX10 σ4 | 0101101 | XXXXXX XXX | 001 | 000 | 000 | 010 | XXX |
| XXXXXXX10 σ5 | 0101101 | XXXXXX XXX | 101 | 000 | 000 | 010 | XXX |
| XXXXXXX10 σ6 | 0101101 | XXXXXX XXX | 101 | 000 | 000 | 010 | XXX |
| XXXXXXX10 | 0101101 | XXXXXX XXX | 101 | 000 | 000 | 010 | XXX |

In general, the word width of the code words allows of three phase positions with valid code words.

Phase position 1:
```
     σ0        σ3          σ6         σ1      etc.
X  0  1 . 0  0  0 . 0  0  0 . 0  1  0 . X   X   X
  CW n       CW n+1      CW n+2      CW n+3    CW n+4
```

Phase position 2:
```
   σX        σ2          σ5         σ0
X  0 . 1  0  0 . 0  0  0 . 0  0  1 . 0   X   X
   CW n      CW n+1     CW n+2     CW n+3
```

Phase position 3:
```
       σ1          σ4          σ7         σ2
X . 0  1   0 . 0  0  0 . 0  0  0 . 1  0  X . X
   CW n       CW n+1      CW n+2      CW n+3
```

Here σ describes the states in a state diagram shown in the IBM Technical Disclosure Bulletin and the dots denote word limits between the code words. Since the sequence of code words is not arbitrary and the selection of a subsequent word depends on the state fixed by the preceding code word, only the phase position 1 represents an actually occurring and unambiguous sequence for synchronizing the decoder. In the phase position 2 the code word 001 should be defined in the state σ5; in the phase position 3 the code word 000 should be defined in the state σ4.

We claim:

1. A synchronization method for a run length-limited (1.7)-code with a code rate of ⅔, said code data bits of a serial data stream being subdivided into two-bit wide data words and transcoded into three-bit wide code words, a sequence of the three-bit wide code words between adjacent ones ("1") comprising at least one zero ("0") but at most seven zeros ("0") and for the phase-correct decoding of the three-bit wide code words, a given synchronization bit sequence is inserted in the data stream of the code words, characterized in that said method comprises the steps:

generating a synchronization sequence comprising at least three consecutive three-bit wide code words as the synchronization bit sequence to be inserted, said sequence having at least six zeros ("0") between two ones ("1"); and defining the temporal position of the inserted synchronization sequence by determining the number of zeros ("0") between two ones ("1") so as to recognize word limits of serially transmitted code words.

2. A synchronization method as claimed in claim 1, characterized in that said synchronization sequence has a bit sequence of "XX0.100.000.001.0XX", in which the dots denote word limits, X denotes an arbitrary bit value, "1" denotes a signal transition, and "0" denotes no signal transition.

3. A synchronization method as claimed in claim 1, characterized in that said synchronization sequence has a bit sequence of "XX0.100.000.010.000.001.0XX", in which the dots denote word limits, X denotes an arbitrary bit value, "1" denotes a signal transition, and "0" denotes no signal transition.

4. A synchronization method as claimed in claim 1, characterized in that the temporal position of the inserted synchronization sequence is determined by comparison with a predetermined bit sequence of the synchronization sequence.

5. A synchronization method as claimed in claim 1, characterized in that the temporal position of the inserted synchronization sequence is determined by counting zeros between two ones and in that, based on the position with respect to time of the recognized synchronization sequence, word limits of code words present in the bit stream are allocated.

6. A circuit arrangement for performing a synchronization for a run length-limited (1.7)-code with a code rate of ⅔, in which code data bits of a serial data stream are subdivided into two-bit wide data words and transcoded into three-bit wide code words, a sequence of the three-bit wide code words between adjacent ones ("1") comprising at least one zero ("0") but at most seven zeros ("0"), and in which, for the phase-correct decoding of the three-bit wide code words, a given synchronization bit sequence is inserted in the data stream of the code words, characterized in that said arrangement comprises:

means for recognizing a synchronization sequence in the stream of code words;

a clock signal generator coupled to receive said stream of code words for deriving a clock signal associated with respect to time with the code words;

a 3-divider coupled to an output of said clock signal generator for frequency division of said clock signal, said 3-divider being reset by a synchronizing signal generated by said recognizing means;

a 3/2-divider also coupled to said output of said clock signal generator for frequency division of the clock signal, said 3/2 divider also being reset by the synchronizing signal generated by the recognizing means;

a series/parallel converter coupled to an output of said recognizing means for series/parallel conversion of serially present code words;

a first register coupled to an output of said series/parallel converter for buffering parallel present code words from the output of the series/parallel converter under control of a code word clock at an output of the 3-divider;

a read-only memory coupled to an output of said first register for code conversion of the code words into data words;

a second register coupled to an output of said read-only memory for buffering the data words supplied by the read-only memory; and a parallel/series converter coupled to an output of said second register which takes over the buffered data words under control of the code word clock and supplies said data words in a bit-serial form under control of a data word clock at an output of the 3/2-divider.

7. A circuit arrangement as claimed in claim 6, characterized in that the means for recognizing synchronization sequences comprises a shift register for receiving said stream of code words and in which code words are serially shifted, and a comparison arrangement coupled to an output of said shift register for receiving said serially shifted code words in parallel form and for comparing said serially shifted code words with a given synchronization sequence.

8. A circuit arrangement as claimed in claim 6, characterized in that the means for recognizing a synchronization sequence comprises a counter for receiving said stream of code words and which counts clocks of the clock signal from said clock signal generator, and a decoder connected to an output of said counter, said counter being reset at signal transitions ("1") in the serial code words by means of a reset signal from an output of said decoder.

9. A circuit arrangement as claimed in claim 8, characterized in that the means for recognizing a synchronization sequence further comprises a register coupled to the output of said decoder, said register being clocked by clocks of the clock signal from said clock signal generator.

10. A circuit arrangement as claimed in claim 6, characterized in that said circuit arrangement further comprises a memory coupled to an input of said series/parallel converter for time-delaying the serial code words applied to the input of the series/parallel converter.

* * * * *